(12) United States Patent
Hong et al.

(10) Patent No.: US 12,398,453 B2
(45) Date of Patent: Aug. 26, 2025

(54) APPARATUS AND METHOD FOR MANUFACTURING DISPLAY APPARATUS

(71) Applicant: Samsung Display Co., Ltd., Yongin-si (KR)

(72) Inventors: Jaemin Hong, Yongin-si (KR); Jihwan Keum, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/106,097

(22) Filed: Feb. 6, 2023

(65) Prior Publication Data

US 2023/0250526 A1    Aug. 10, 2023

(30) Foreign Application Priority Data

Feb. 8, 2022  (KR) .......................... 10-2022-0016431

(51) Int. Cl.
  *C23C 14/04*  (2006.01)
  *B05C 11/02*  (2006.01)

(52) U.S. Cl.
  CPC ............ *C23C 14/042* (2013.01); *B05C 11/02* (2013.01)

(58) Field of Classification Search
  None
  See application file for complete search history.

(56) References Cited

U.S. PATENT DOCUMENTS

| | | | |
|---|---|---|---|
| 8,325,457 B2 * | 12/2012 | Park | H01L 21/6831 361/230 |
| 8,402,917 B2 | 3/2013 | Ko et al. | |
| 9,666,346 B2 * | 5/2017 | Noh | C23C 14/042 |
| 9,765,428 B2 * | 9/2017 | Han | C23C 16/042 |
| 9,773,600 B2 * | 9/2017 | Han | C23C 14/042 |
| 9,959,961 B2 * | 5/2018 | White | G03F 7/707 |
| 10,186,662 B2 * | 1/2019 | Kim | H10K 71/00 |
| 11,414,739 B2 * | 8/2022 | Lin | C23C 14/12 |
| 11,624,108 B2 * | 4/2023 | Moon | C23C 14/24 118/721 |
| 11,781,210 B2 * | 10/2023 | Hong | B05C 21/005 118/504 |
| 12,097,720 B2 * | 9/2024 | Loginov | B42D 25/405 |
| 2010/0267227 A1 * | 10/2010 | Ko | C23C 14/042 156/60 |

(Continued)

FOREIGN PATENT DOCUMENTS

| | | |
|---|---|---|
| KR | 10-2010-0114685 | 10/2010 |
| KR | 10-1083443 | 11/2011 |

(Continued)

*Primary Examiner* — Jethro M. Pence
(74) *Attorney, Agent, or Firm* — KILE PARK REED & HOUTTEMAN PLLC

(57) ABSTRACT

An apparatus for manufacturing a display apparatus includes: a chamber; a mask assembly disposed in the chamber on a first side of a display substrate; a deposition source disposed to face the mask assembly and supplying a deposition material that passes through the mask assembly; and a magnetic force portion including a plurality of magnets extending in a first direction parallel to the mask assembly and disposed on a side opposite to the first side of the display substrate. The magnetic force portion reciprocates in a direction intersecting the first direction.

12 Claims, 11 Drawing Sheets

(56) References Cited

U.S. PATENT DOCUMENTS

| | | | | |
|---|---|---|---|---|
| 2015/0056370 A1* | 2/2015 | Lee | ................... | C23C 14/042 |
| | | | | 118/721 |
| 2015/0083045 A1* | 3/2015 | You | ................... | H10K 71/166 |
| | | | | 118/721 |
| 2015/0348812 A1* | 12/2015 | White | ................ | H01F 7/0252 |
| | | | | 118/504 |
| 2016/0248049 A1* | 8/2016 | Hong | ................. | C23C 14/042 |
| 2016/0289814 A1 | 10/2016 | Han | | |
| 2020/0140989 A1 | 5/2020 | Kim et al. | | |
| 2022/0290288 A1 | 9/2022 | Hong et al. | | |
| 2024/0318297 A1* | 9/2024 | Lee | ................... | C23C 14/042 |
| 2024/0324434 A1* | 9/2024 | Kim | ................... | C23C 14/042 |

FOREIGN PATENT DOCUMENTS

| | | |
|---|---|---|
| KR | 10-2016-0104194 | 9/2016 |
| KR | 10-2016-0117797 | 10/2016 |
| KR | 10-2091560 | 3/2020 |
| KR | 10-2020-0051884 | 5/2020 |
| KR | 10-2022-0126847 | 9/2022 |

\* cited by examiner

APPARATUS AND METHOD FOR MANUFACTURING DISPLAY APPARATUS

CROSS-REFERENCE TO RELATED APPLICATION

This application claims priority to and benefit of Korean Patent Application No. 10-2022-0016431 under 35 U.S.C. § 119, filed on Feb. 8, 2022, in the Korean Intellectual Property Office (KIPO), the disclosure of which is incorporated by reference herein in its entirety.

BACKGROUND

1. Technical Field

One or more embodiments relate to apparatuses and methods for manufacturing a display apparatus which may prevent a stain defect of a display apparatus.

2. Description of the Related Art

Recently, electronic apparatuses have been widely used. Electronic apparatuses are variously used as mobile electronic apparatuses and stationary electronic apparatuses, and the electronic apparatuses include a display apparatus capable of providing a user with visual information, such as an image or a video, to support various functions.

A display apparatus is an apparatus for displaying data visually and is formed by depositing various layers, such as an organic layer, a metal layer, and the like. A deposition material may be deposited to form multiple layers of a display apparatus. In other words, a deposition source ejects a deposition material to be deposited on a substrate through a mask. In case that the mask and the substrate poorly adhere to each other, the deposition material may not be uniformly deposited on the substrate.

The background description above is technology information of the disclosure, and it cannot be said that it is known technology disclosed to the general public before the filing of the disclosure.

SUMMARY

One or more embodiments provide an apparatus and method for manufacturing a display apparatus which enable a mask and a substrate to uniformly and well adhere to each other.

However, such an objective of the disclosure is not limited to the above-mentioned object, and other objects of the disclosure will be apparent to those skilled in the art from the following descriptions.

Additional aspects will be set forth in part in the description which follows and, in part, will be apparent from the description, or may be learned by practice of the presented embodiments of the disclosure.

According to an aspect of the disclosure, an apparatus for manufacturing a display apparatus may include a chamber, a mask assembly disposed in the chamber on a first side of a display substrate, a deposition source disposed to face the mask assembly and supplying a deposition material that passes through the mask assembly, and a magnetic force portion including a plurality of magnets extending in a first direction parallel to the mask assembly and disposed on a side opposite to the first side of the display substrate. The magnetic force portion may reciprocate in a direction intersecting the first direction.

In an embodiment, the magnetic force portion may repeat a first movement of moving from a stop position in the direction intersecting the first direction and returning to the stop position.

In an embodiment, during the first movement, a distance that the magnetic force portion moves may be less than a distance between adjacent ones of the plurality of magnets.

In an embodiment, during the first movement, a distance that the magnetic force portion moves may be a multiple of a distance between adjacent ones of the plurality of magnets.

In an embodiment, the direction intersecting the first direction may be perpendicular to the first direction.

In an embodiment, the direction intersecting the first direction may form an acute angle with the first direction.

In an embodiment, the magnetic force portion may repeat a first movement of moving from a stop position in the direction intersecting the first direction and returning to the stop position, and a second movement of moving from the stop position in a direction opposite to the direction intersecting the first direction and returning to the stop position.

In an embodiment, the magnetic force portion may further include a support plate accommodating the plurality of magnets and capable of moving, and the apparatus may further include a driving portion that reciprocates the support plate in the direction intersecting the first direction.

In an embodiment, the plurality of magnets may be spaced apart from each other in a second direction intersecting the first direction. The plurality of magnets may include first magnets, each including a side facing the mask assembly having a polarity of N and second magnets, each including a side facing the mask assembly having a polarity of S. The first magnets and the second magnets may be alternately arranged.

In an embodiment, a magnetic force of the magnetic force portion in the second direction may include a sine curve.

In an embodiment, the magnetic force portion may reciprocate in the second direction.

In an embodiment, the mask assembly may include a plurality of mask sheets extending in the second direction, and the magnetic force portion may reciprocate in the second direction.

According to another aspect of the disclosure, a method of manufacturing a display apparatus may include disposing a display substrate in a chamber such that a first side of the display substrate faces a mask assembly, disposing a magnetic force portion on a second side opposite to the first side of the display substrate, the magnetic force portion including a plurality of magnets extending in a first direction parallel to the mask assembly, applying, by the magnetic force portion, a magnetic force to the mask assembly such that the mask assembly is adhered to the display substrate, and reciprocating the magnetic force portion in a direction intersecting the first direction.

In an embodiment, the magnetic force portion may repeat a first movement of moving from a stop position in the direction intersecting the first direction and returning to the stop position.

In an embodiment, during the first movement, a distance that the magnetic force portion moves may be less than a distance between adjacent ones of the plurality of magnets.

In an embodiment, during the first movement, a distance that the magnetic force portion moves may be a multiple of a distance between adjacent ones of the plurality of magnets.

In an embodiment, the direction intersecting the first direction may be perpendicular to the first direction.

In an embodiment, the direction intersecting the first direction may form an acute angle with the first direction.

In an embodiment, the magnetic force portion may repeat a first movement of moving from a stop position in the direction intersecting the first direction and returning to the stop position, and a second movement of moving from the stop position in a direction opposite to the direction intersecting the first direction and returning to the stop position.

In an embodiment, a magnetic force applied by the magnetic force portion to a point of the mask assembly may vary.

Other aspects, features, and advantages not described above, will become apparent from the following drawings, claims, and detailed descriptions to embody the disclosure below.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
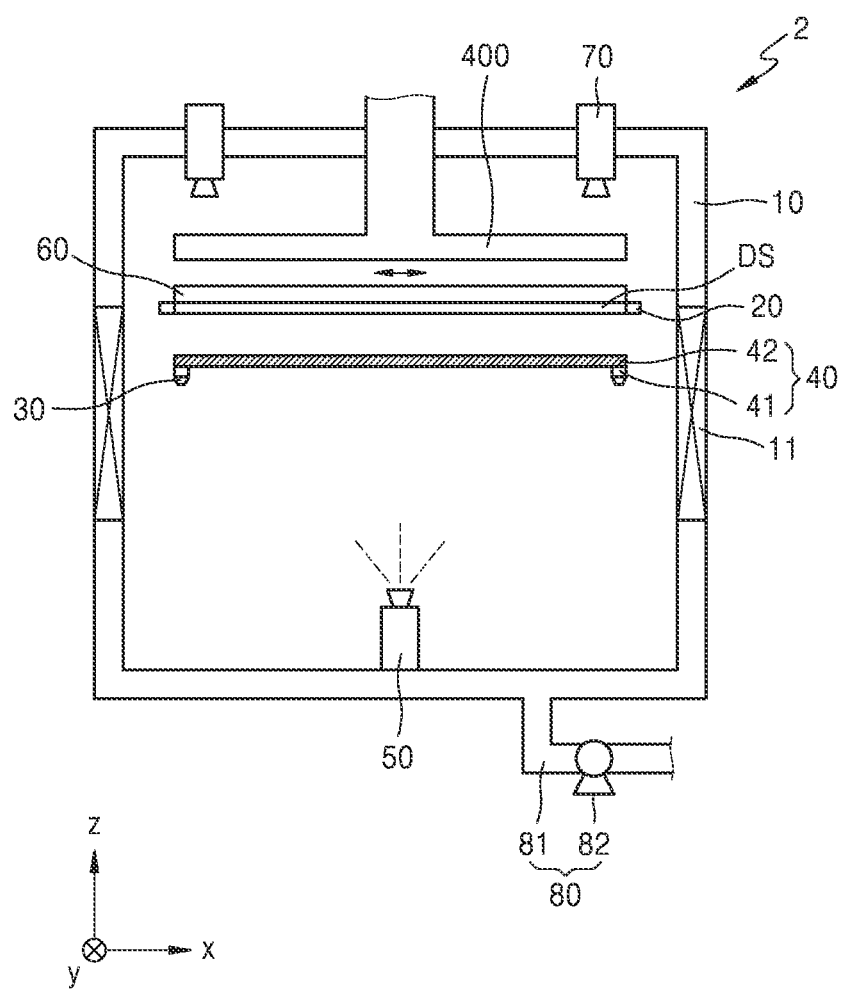
FIG. 1 is a schematic cross-sectional view of an apparatus for manufacturing a display apparatus according to one or more embodiments.

Reference will now be made in detail to embodiments of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the embodiments, and particular embodiments will be illustrated in the drawings and described in the detailed description section. The effect and features of the embodiments, and a method to achieve the same, will be clearer referring to the detailed descriptions below with the drawings. However, the embodiments may be implemented in various forms, not by being limited to the embodiments presented below.

Hereinafter, embodiments will be described, in detail, with reference to the accompanying drawings, and in the description with reference to the drawings, the same or corresponding constituents are indicated by the same reference numerals and redundant descriptions thereof are omitted.

In the following embodiment, it will be understood that although the terms "first," "second," etc. may be used herein to describe various components, these components should not be limited by these terms. These components are only used to distinguish one component from another. Thus, a first element discussed below could be termed a second element without departing from the teachings of the disclosure.

In the following embodiment, the singular forms, "a," "an," and "the" are intended to include the plural forms as well, unless the context clearly indicates otherwise.

In the following embodiment, it will be further understood that the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

In the following embodiment, when an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Sizes of components in the drawings may be exaggerated for convenience of explanation. For example, since sizes and thicknesses of components in the drawings are arbitrarily illustrated for convenience of explanation, the following embodiments are not limited thereto.

In the following embodiment, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic cross-sectional view of an apparatus 2 for manufacturing a display apparatus, according to one or more embodiments.

The apparatus 2 for manufacturing a display apparatus may include a chamber 10, a first support portion 20, a second support portion 30, a mask assembly 40, a deposition source 50, a pressing portion 60, a magnetic force portion 400, a vision portion 70, and a pressure adjustment portion 80.

The chamber 10 may have a space formed therein, and a display substrate DS and the mask assembly 40 may be accommodated in the space. A portion of the chamber 10 may be formed to be open, and a gate valve 11 may be installed in the open portion of the chamber 10. The open portion of the chamber 10 may be opened or closed according to the operation of the gate value 11.

The display substrate DS may mean a display substrate DS during manufacturing of a display apparatus, in which at least one of organic layers, inorganic layers, and metal layers is deposited on a substrate 100 to be described below. In another embodiment, the display substrate DS may be a substrate 100 on which any of an organic layer, an inorganic layer, and a metal layer has not yet been deposited.

The first support portion 20 may support the display substrate DS. The first support portion 20 may be in the form of a plate fixed inside the chamber 10. In another embodiment, the first support portion 20 may be in the form of a shuttle on which the display substrate DS is accommodated, and capable of performing linear motion inside the chamber 10. In another embodiment, the first support portion 20 may include an electrostatic chuck or an adhesive chuck that is fixed to the chamber 10 or arranged in the chamber 10 to be movable inside the chamber 10.

The second support portion 30 may support the mask assembly 40. The second support portion 30 may be disposed inside the chamber 10. The second support portion 30 may be capable of fine-tuning the position of the mask assembly 40. The second support portion 30 may include a separate driving portion, an alignment unit, and the like to allow the mask assembly 40 to move in different directions.

In another embodiment, the second support portion 30 may be in the form of a shuttle. The second support portion 30 may transfer the mask assembly 40 that is accommodated thereon. For example, the second support portion 30 may move to the outside of the chamber 10 and enter the inside of the chamber 10 from the outside thereof after the mask assembly 40 is accommodated thereon.

The first support portion 20 and the second support portion 30 may be integral with each other. The first support portion 20 and the second support portion 30 may include a movable shuttle. The first support portion 20 and the second support portion 30 may include a structure to fix the mask assembly 40 and the display substrate DS while the display substrate DS is accommodated on the mask assembly 40, and it is possible to linearly move the display substrate DS and the mask assembly 40 at the same time.

However, in the following description, for convenience of explanation, a case in which the first support portion 20 and the second support portion 30 are separately formed and disposed at different positions inside the chamber 10 is described in detail.

The deposition source 50 may be disposed to face the mask assembly 40. A deposition material may be contained in the deposition source 50, and by heating the deposition material, the deposition material may evaporate or sublimate. The deposition source 50 may be disposed inside the chamber 10 to be fixed or capable of performing motion in one or more directions.

The mask assembly 40 may be disposed inside the chamber 10. The mask assembly 40 may include a mask frame 41 and a mask sheet 42.

The mask frame 41 may be formed as multiple frames that are connected to each other, and may have an opening formed by penetrating a central portion of the mask frame 41. The inside of the mask frame 41 may be formed in the form of a grid.

The mask sheet 42 may be mounted in a tensioned state on the mask frame 41. The opening at the center of the mask frame 41 may be covered by the mask sheet 42. In an embodiment, at least one mask sheet may be provided, and in case that two or more mask sheets are provided, the mask sheets 42 may be disposed parallel to each other on the mask frame 41. For example, the mask sheets 42 may be arranged parallel to each other in one direction, for example, a y direction of FIG. 1. In the embodiment, each of the mask sheets 42 may have a shape extending in a direction, for example, an x direction of FIG. 1, crossing (or intersecting) the one direction. Both end portions of the mask sheet 42 may be fixed on the mask frame 41 by a method, for example, welding.

The mask sheet 42 may include at least one pattern hole. The pattern hole may be a through-hole formed to allow the deposition material to pass through the mask sheet 42. The deposition material that has passed through the mask sheet 42 may be deposited on the substrate 100.

The magnetic force portion 400 may be disposed inside the chamber 10 to face the display substrate DS and/or the mask assembly 40. The magnetic force portion 400 may apply a magnetic force to the mask assembly 40 to press the mask assembly 40 against the display substrate DS. In particular, the magnetic force portion 400 may prevent sagging of the mask sheet 42, and may also position the mask sheet 42 to be adjacent to the display substrate DS. Furthermore, the magnetic force portion 400 may maintain a uniform interval between the mask sheet 42 and the display substrate DS, which is described below.

The pressing portion 60 may be disposed above the display substrate DS, for example, on the opposite side of the mask sheet 42. The pressing portion 60 may press the display substrate DS toward the mask sheet 42 so that the display substrate DS is in close contact with the mask sheet 42. In an embodiment, the pressing portion 60 may include a plate having a weight, and may press the display substrate DS with a load of the plate.

The vision portion 70 may be disposed in the chamber 10 and may photograph the locations of the display substrate DS and the mask assembly 40. The vision portion 70 may include a camera for photographing the display substrate DS and the mask assembly 40. The locations of the display substrate DS and the mask assembly 40 may be identified based on an image captured by the vision portion 70, and the deformation of the mask assembly 40 may be checked. Furthermore, based on the image, the first support portion 20 may fine-tune the location of the display substrate DS, or the second support portion 30 may fine-tune the location of the mask assembly 40. However, in the following description, a case in which the locations of the display substrate DS and the mask assembly 40 are aligned with each other by fine-tuning the location of the mask assembly 40 at the second support portion 30 is described in detail.

The pressure adjustment portion 80 may be connected to the chamber 10 to adjust a pressure inside the chamber 10. For example, the pressure adjustment portion 80 may adjust the pressure inside the chamber 10 to be identical or similar to atmospheric pressure. Furthermore, the pressure adjustment portion 80 may adjust the pressure inside the chamber 10 to be identical or similar to a vacuum state.

The pressure adjustment portion 80 may include a connection pipe 81 connected to the chamber 10 and a pump 82 mounted on the connection pipe 81. According to the operation of the pump 82, external air may be introduced through the connection pipe 81 or a gas in the chamber 10 may be guided to the outside through the connection pipe 81.

In a method of manufacturing a display apparatus (not shown) by using the apparatus 2 for manufacturing a display apparatus described above, first, the display substrate DS may be prepared.

The pressure adjustment portion 80 may maintain the inside of the chamber 10 in a state that is the same as or similar to atmospheric pressure, and as the gate valve 11 operates, the open portion of the chamber 10 may be opened.

The display substrate DS may be loaded into the chamber 10 from the outside. The display substrate DS may be loaded into the chamber 10 in various methods. For example, the display substrate DS may be loaded into the chamber 10 from the outside through a robot arm or the like disposed outside the chamber 10. In another embodiment, in case that the first support portion 20 is formed in the form of a shuttle, it is possible that the first support portion 20 may be drawn from the inside of the chamber 10 to the outside of the chamber 10, the display substrate DS may be placed on the first support portion 20 through a separate robot arm or the like disposed outside the chamber 10, and the first support portion 20 may be loaded from the outside of the chamber 10 into the chamber 10.

The mask assembly 40 may be in a state of being disposed inside the chamber 10 as described above. In another embodiment, the mask assembly 40 may be loaded from the outside of the chamber 10 into the chamber 10 identically or similarly to the display substrate DS.

In case that the display substrate DS is loaded into the chamber 10, the display substrate DS may be accommodated on the first support portion 20. The vision portion 70 may photograph the locations of the display substrate DS and the mask assembly 40. The locations of the display substrate DS and the mask assembly 40 may be identified based on an image captured by the vision portion 70. The apparatus 2 for manufacturing a display apparatus may include a separate controller (not shown) so as to identify the locations of the display substrate DS and the mask assembly 40.

In case that the identification of the locations of the display substrate DS and the mask assembly 40 is completed, the second support portion 30 may fine-tune the location of the mask assembly 40.

The deposition source 50 may operate to supply a deposition material to a side of the mask assembly 40, and the deposition material that has passed through pattern holes of the mask sheet 42 may be deposited on the display substrate DS. The deposition source 50 may move parallel to the display substrate DS and the mask assembly 40, or the display substrate DS and the mask assembly 40 may move parallel to the deposition source 50. In other words, the deposition source 50 may move relative to the display substrate DS and the mask assembly 40. The pump 82 may draw the gas inside the chamber 10 and may discharge the gas to the outside so that the pressure inside the chamber 10 may be maintained in the same or similar form as vacuum.

The deposition material supplied from the deposition source 50 may be at a high temperature. Accordingly, the mask assembly 40, particularly the mask sheet 42, may have a problem of thermal deformation, sagging due to load, and the like. The magnetic force of the magnetic force portion 400 may apply a magnetic force to the mask sheet 42 to prevent the sagging of the mask sheet 42 so that the mask sheet 42 is uniformly adhered to the display substrate DS.

As described above, the deposition material supplied from the deposition source 50 may pass through the mask assembly 40 to be deposited on the display substrate DS. Accordingly, multiple layers, for example, an organic layer, a metal layer, and the like, to be stacked each other on a display apparatus described below may be formed.

Figure 2:
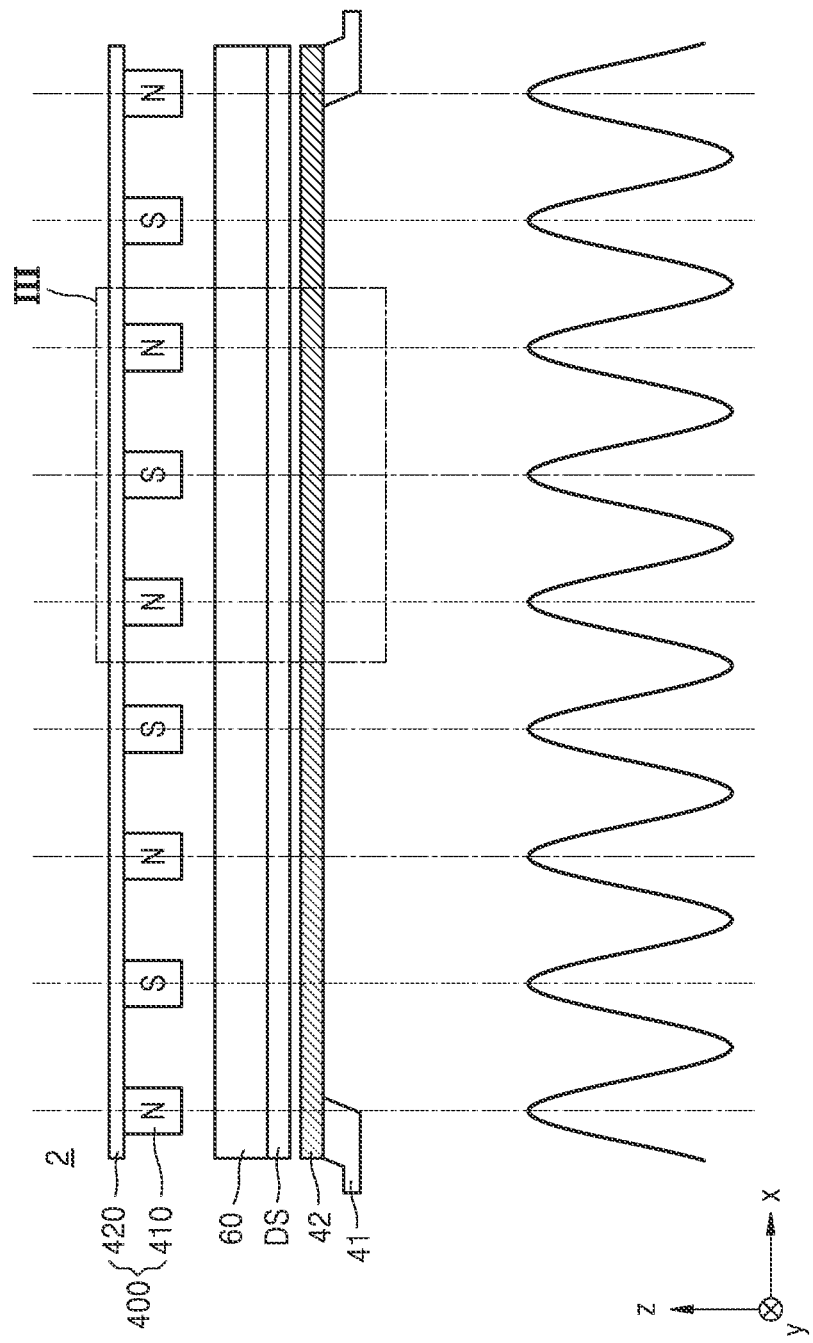
FIG. 2 is a schematic cross-sectional view of an apparatus for manufacturing a display apparatus according to one or more embodiments.

FIG. 2 is a schematic cross-sectional view of an apparatus for manufacturing a display apparatus according to one or more embodiments. In FIG. 2, for convenience of explanation, support portions are omitted, and the mask assembly 40 and the magnetic force portion 400 are illustrated.

Referring to FIG. 2, the display substrate DS may be disposed inside a chamber by being supported by a first support portion (not shown). The mask assembly 40 may be disposed on a first side, in a direction perpendicular to one surface of the display substrate DS, for example, a side in a −z direction of FIG. 2. In detail, the mask frame 41 having an opening at the center thereof and the mask sheet 42 covering the opening may be disposed. The display substrate DS and the mask sheet 42 may be disposed adjacent to each other.

In an embodiment, the mask sheet 42 may include at least one mask sheet, and in case that the mask sheet 42 includes two or more mask sheets, the mask sheets 42 may be disposed parallel to each other on the mask frame 41. For example, the mask sheets 42 may be arranged parallel to each other in one direction, for example, the y direction of FIG. 1. Each of the mask sheets 42 may have a shape extending in a direction, for example, the x direction of FIG. 1, crossing the one direction. Both end portions of the mask sheet 42 may be fixed on the mask frame 41 by a method, for example, welding.

The magnetic force portion 400 may be disposed on a second side, opposite to the first side, for example, a side in the z direction of FIG. 2, of the display substrate DS. The magnetic force portion 400 may apply a magnetic force so that the mask sheet 42 faces the display substrate DS.

The mask sheet 42 may sag in the direction of gravity due to a load thereof, which may cause a deposition defect in a display apparatus. In detail, as the mask sheet 42 and the display substrate DS do not closely adhere to each other in a partial area due to the sagging of the mask sheet 42, a shadow that the deposition material is partially deposited may occur. In case that the magnetic force portion 400 is disposed, such a deposition defect may be prevented.

In an embodiment, the magnetic force portion 400 may include a magnet 410 and a support plate 420.

The magnet 410 may include multiple magnets. For example, as illustrated in FIG. 2, the magnet 410 may include nine magnets, but the disclosure is not limited thereto, and the number of magnets 410 may vary depending on the sizes of the display substrate DS and the mask sheet 42 corresponding thereto. In the following description, for convenience of explanation, as illustrated in FIG. 2, a case in which the magnet 410 includes nine magnets is described.

The magnets 410 may be accommodated on the support plate 420. In other words, the support plate 420 may be a plate supporting the magnets 410. In an embodiment, the magnets 410 supported on the support plate 420 may be disposed on a plane substantially parallel to the mask sheet 42.

Each of the magnets 410 may extend in a first direction, for example, a y direction of FIG. 2. The magnets 410 may be spaced apart from each other in a second direction, for example, an x direction of FIG. 2, crossing the first direction. In other words, the magnets 410 may be arranged apart from each other in a direction (the x direction of FIG. 2) perpendicular to a lengthwise direction (the y direction of FIG. 2) of the magnet 410. Furthermore, in an embodiment, a separation distances s between the magnets 410 may be identical from each other.

The direction in which the magnet 410 extends and the direction in which the mask sheet 42 extends may cross each other. Furthermore, a direction in which the magnets 410 are arranged and a direction in which the mask sheets 42 are arranged may cross each other. In an embodiment, a first direction in which the magnet 410 extends may be the same as a direction in which the mask sheets 42 are arranged, or a second direction in which the magnets 410 are arranged may be the same as a direction in which the mask sheet 42 extends.

Furthermore, in an embodiment, the magnets 410 may be spaced apart from each other in the second direction, and the magnet 410 in which the polarity of a side facing the mask sheet 42 is N and the magnet 410 in which the polarity of a side facing the mask sheet 42 is S may be alternately arranged.

Accordingly, a magnetic force applied to one of the mask sheets 42 may follow, as illustrated in FIG. 2, a sine curve (or a cosine curve) in the lengthwise direction (the x direction of FIG. 2) of the mask sheet 42.

Figure 3:
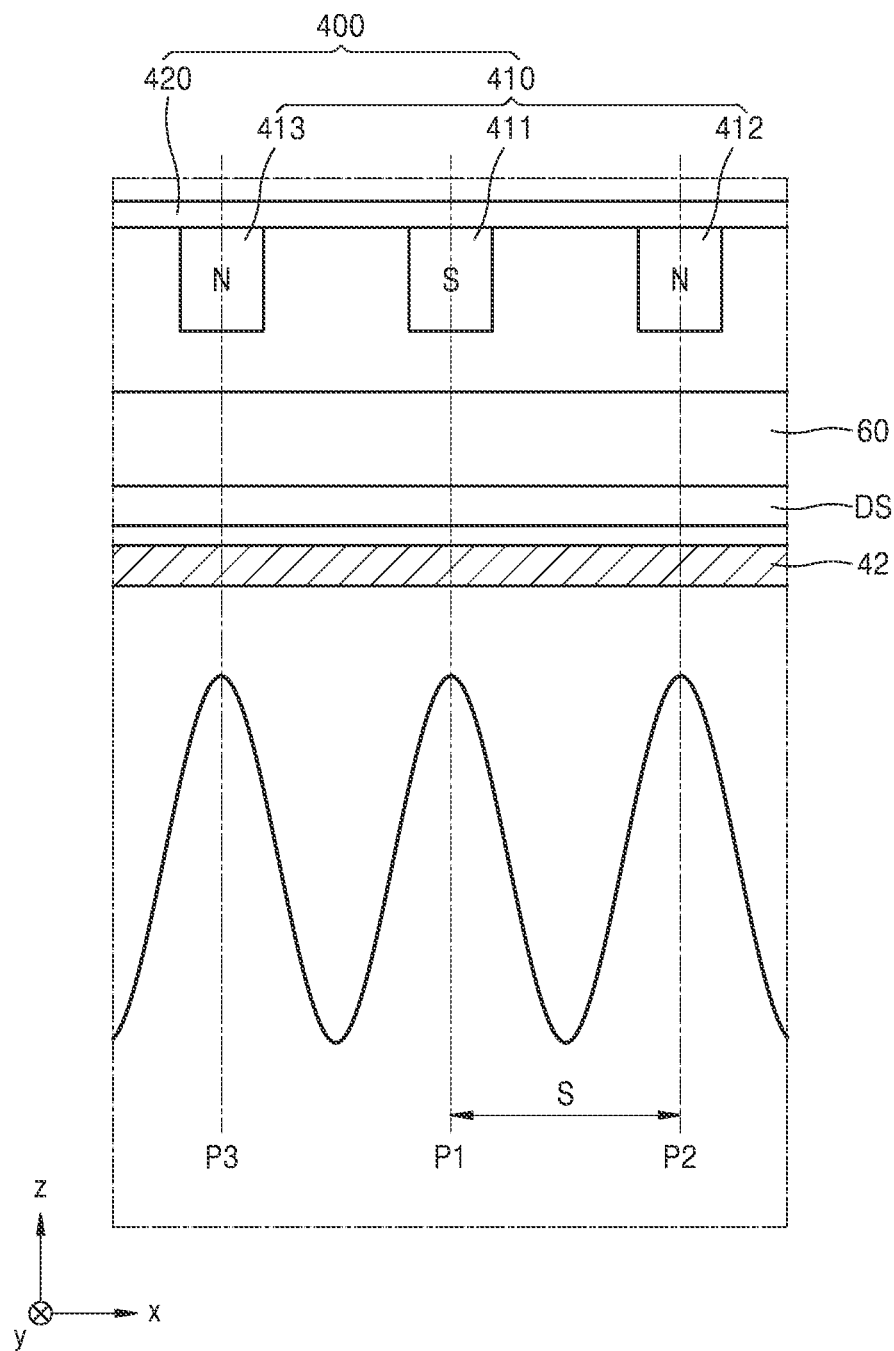
FIG. 3 is a schematic cross-sectional view of an apparatus for manufacturing a display apparatus by enlarging region III of FIG. 2.

FIG. 3 is a schematic cross-sectional view of an apparatus for manufacturing a display apparatus by enlarging region III of FIG. 2. Furthermore, a magnetic force acting on the mask sheet 42 corresponding to the region III is illustrated together.

Referring to FIG. 3, the magnets 410 may include a first magnet 411, a second magnet 412, and a third magnet 413. The second magnet 412 may be disposed adjacent to the first magnet 411 on one side, for example, in an x direction of FIG. 3, and the third magnet 413 may be disposed adjacent to the first magnet 411 on another side, for example, in a −x direction of FIG. 3, opposite to the second magnet 412.

A magnetic force along a sine curve (or a cosine curve) in the lengthwise direction may act on the mask sheet 42, as described above.

In detail, in the lengthwise direction of the mask sheet 42, a maximum magnetic force may act on a point corresponding to the magnet 410, for example, a first point P1 under the first magnet 411, a second point P2 under the second magnet 412, and a third point P3 under the third magnet 413. Furthermore, in the lengthwise direction of the mask sheet 42, a minimum magnetic force may act on a point that does not correspond to the magnets 410, for example, a middle point between the first point P1 and the second point P2 and a middle point between the first point P1 and the third point P3.

Accordingly, the magnetic force acting in the lengthwise direction of the mask sheet 42 may be represented as a sine curve with a cycle of a distance S between the first magnet 411 and the second magnet 412, for example, the distance S between the first point P1 and the second point P2.

Figure 4:
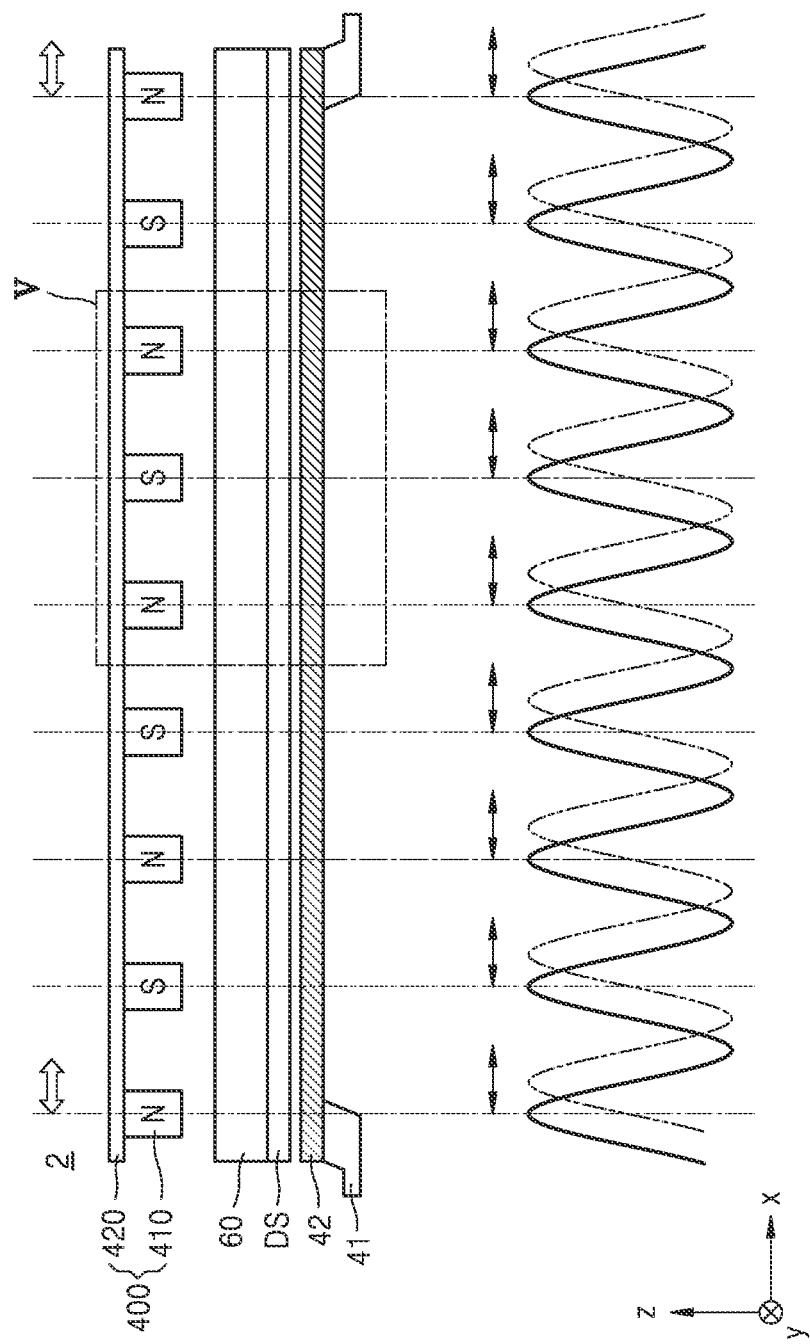
FIG. 4 is a schematic cross-sectional view of an apparatus for manufacturing a display apparatus according to one or more embodiments.

FIG. 4 is a schematic cross-sectional view of an apparatus for manufacturing a display apparatus according to one or more embodiments.

Referring to FIG. 4, the magnetic force portion 400 may reciprocate in a third direction crossing a first direction, for example, a y direction of FIG. 4, in which the magnet 410 extends. To this end, a driving portion (not shown) may be connected to the support plate 420. The driving portion may repeatedly reciprocate the support plate 420 to perform a periodic motion. The driving portion may include, for example, a motor or a cylinder.

As the driving portion reciprocates the support plate 420, the magnets 410 connected to and supported by the support plate 420 may be also reciprocated.

In an embodiment, the magnetic force portion 400 may reciprocate in a direction perpendicular to the first direction in which the magnet 410 extends. It may mean that the magnetic force portion 400 reciprocates in the second direction, for example, an x direction of FIG. 4, in which the magnets 410 are spaced apart from each other. In other words, it may mean that the third direction in which the magnetic force portion 400 reciprocates is the same as the second direction in which the magnets 410 are spaced apart from each other.

Figure 5:
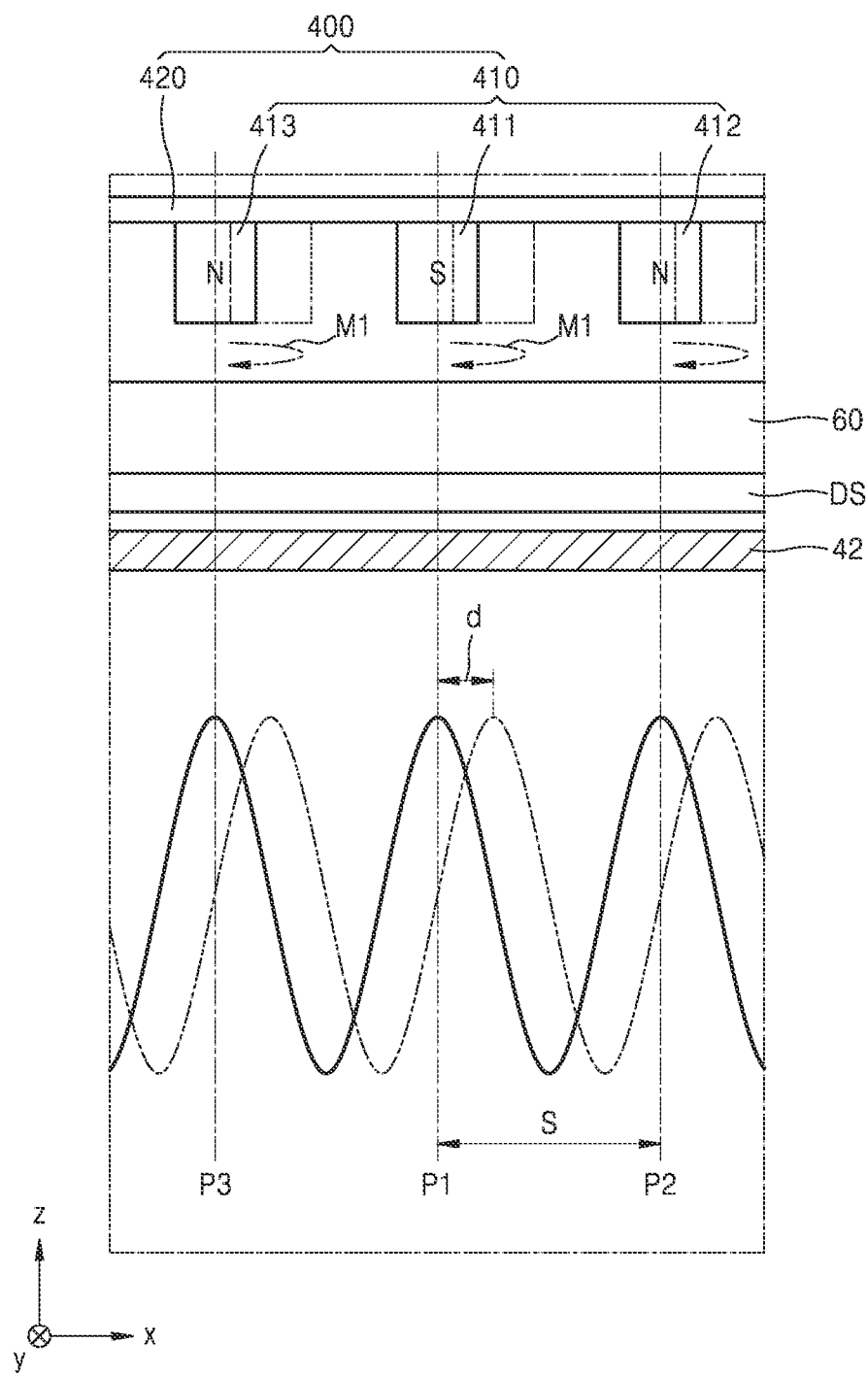
FIG. 5 is a schematic cross-sectional view of an apparatus for manufacturing a display apparatus by enlarging region V of FIG. 4.

FIG. 5 is a schematic cross-sectional view of an apparatus for manufacturing a display apparatus by enlarging region V of FIG. 4. Furthermore, a magnetic force acting on the mask sheet 42 corresponding to the region V is illustrated together.

Referring to FIG. 5, the magnets 410 may reciprocate in a third direction, for example, an x direction of FIG. 5. In detail, the magnets 410 may repeat a first movement M1 of moving in the third direction from a stop position illustrated in FIG. 3 and then returning to the stop position. In another embodiment, the magnets 410 may repeat a second movement M2 (not shown) of moving in a fourth direction, for example, a −x direction of FIG. 5, opposite to the third direction and then returning to the stop position. As the first movement M1 and the second movement M2 are similar to each other except the direction, in the following description, the first movement M1 is described below.

As the magnets 410 perform the first movement M1, a magnetic force acting on the mask sheet 42 may continuously change. In detail, the first point P1, the second point P2, and the third point P3, at which the magnetic force has the maximum value at the stop position, may not continuously have the maximum value of the magnetic force, but may have moments of receiving a magnetic force less than the maximum value. Accordingly, an average magnetic force of the first point P1, the second point P2, and the third point P3 may be less than the maximum value of the magnetic force. The average magnetic force may mean an average value of the magnetic force acting on one point during the first movement M1.

Similar thereto, the middle point between the first point P1 and the second point P2 and the middle point between the first point P1 and the third point P3, at which the magnetic force has the minimum value at the stop position, may not continuously have the minimum value of the magnetic force, but may have moments of receiving a magnetic force greater than the minimum value. Accordingly, at the middle points, the average magnetic force may be greater than the minimum value of the magnetic force, during the first movement M1.

Although the points having the maximum value and the minimum value of the magnetic force at the stop position are described as an embodiment, the magnetic force may vary with respect to entire area of the mask sheet 42 in the same method. In other words, the average magnetic force acting on each point of the mask sheet 42 may be a value obtained by dividing an integral value of a sine function corresponding to a distance d that the magnet 410 moves from each point by time. Accordingly, with respect to entire area of the mask sheet 42, the average magnetic force may approach a middle value between the maximum value and the minimum value of the magnetic force, compared to the magnetic force acting at the stop position.

Compared to a case in which the magnetic force portion 400, for example, the magnets 410 continuously applies a magnetic force to the mask sheet 42 at the stop position without changing the total amount of the magnetic force acting on the mask sheet 42, the average magnetic force acting on each point of the mask sheet 42 may approach the middle value. Furthermore, the maximum value and the minimum value of the magnetic force may not concentrate on a particular point of the mask sheet 42.

In generally, in case that the magnetic force portion 400 is fixed at the stop position, adhesion between the mask sheet 42 and the display substrate DS may not be good at a point of the mask sheet 42 on which the minimum magnetic force continuously acts, for example, the middle point between the first point P1 and the second point P2 and the middle point between the first point P1 and the third point P3. Accordingly, at these points, the deposition material may not be properly deposited on the display substrate DS so that line mura may be generated in a display apparatus.

In the apparatus 2 for manufacturing a display apparatus, according to one or more embodiments, as described above, due to the reciprocation of the magnetic force portion 400, a relatively uniform magnetic force may be applied to the mask sheet 42, and thus, a deposition defect, such as line mura, in a display apparatus may be prevented.

In an embodiment, during the first movement M1, the distance d that the magnetic force portion 400 moves in the third direction may be less than the distance S between the two adjacent magnets 410 among the magnets 410. For example, the distance d may be less than the distance S between the first magnet 411 and the second magnet 412.

Figure 6:
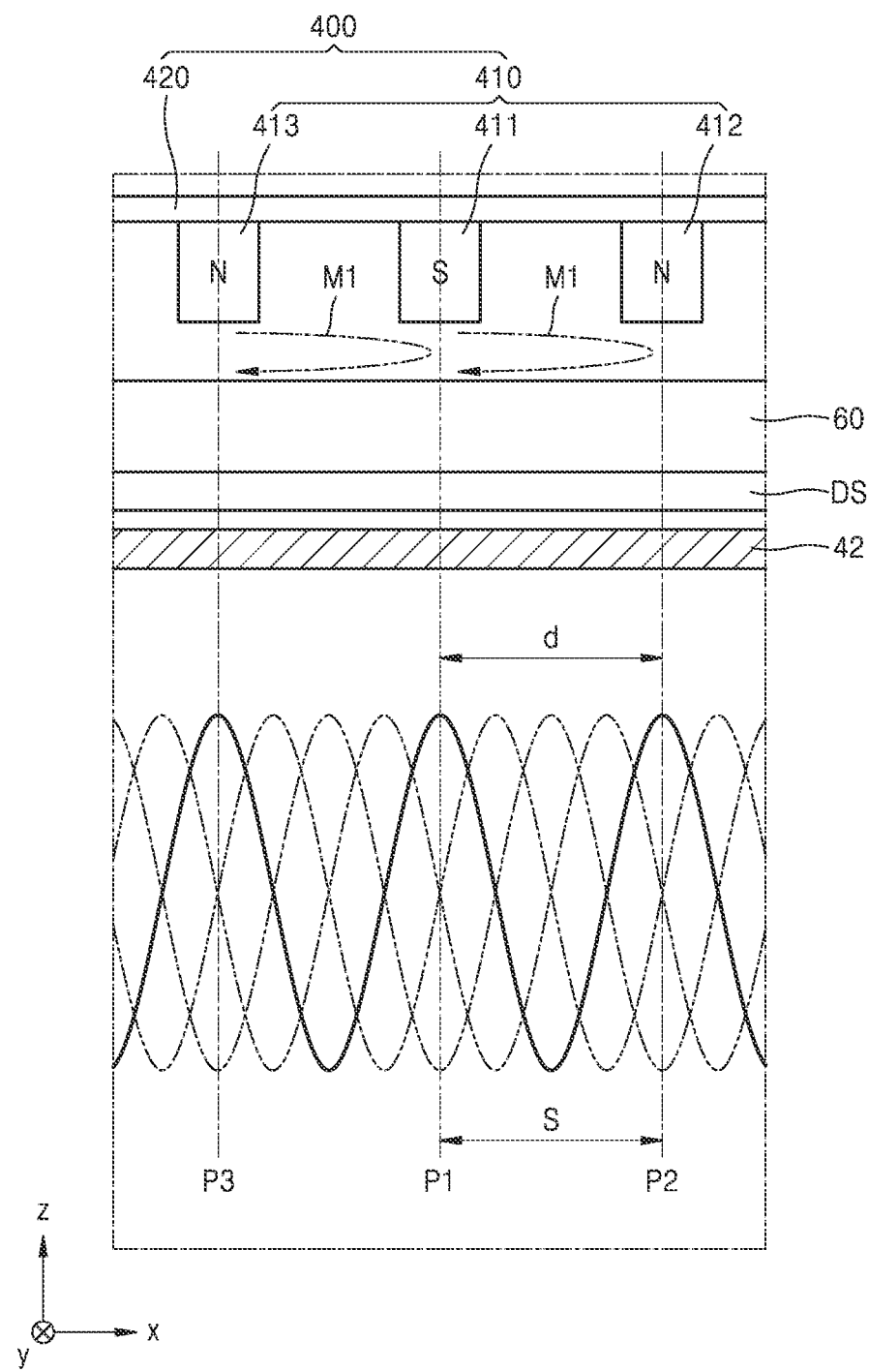
FIG. 6 is a schematic cross-sectional view of an apparatus for manufacturing a display apparatus according to one or more embodiments.

FIG. 6 is a schematic cross-sectional view of an apparatus for manufacturing a display apparatus according to one or more embodiments.

Referring to FIG. 6, in an embodiment, during the first movement M1, the distance d that the magnetic force portion 400 moves in the third direction may be equal to the distance S between the two adjacent magnets 410 among the magnets 410. For example, during the first movement M1, the distanced that the magnetic force portion 400 moves in the third direction may be the same as the distance S between the first magnet 411 and the second magnet 412. Furthermore, because the distance that the magnetic force portion 400 moves in the third direction and the distance that the magnetic force portion 400 moves back to the stop position are identical, in the following description, the movement of the magnetic force portion 400 in the third direction will be only described.

In this embodiment, each of the magnets 410 may move the distanced equal to the distance S between the first magnet 411 and the second magnet 412, which corresponds to the period of the sine function. In other words, the average magnetic forces acting on entire area of the mask sheet 42 during the first movement M1 may be all identical as the middle value of the magnetic force. Accordingly, the same average magnetic force may be applied entire area of the mask sheet 42, and thus, a uniform degree of adhesion may be provided to entire area between the mask sheet 42 and the display substrate DS.

In another embodiment, during the first movement M1, the distance d that the magnetic force portion 400 moves in the third direction may be a multiple of the distance S between the two adjacent magnets 410 among the magnets 410. For example, the distance d may be twice the distance S between the first magnet 411 and the second magnet 412. As in the case in which the magnetic force portion 400 described above moves the same distance as the distance S between the first magnet 411 and the second magnet 412, each of the magnets 410 may move a multiple of the distance S corresponding to the period of the sine function, which is same as the distance d between the first magnet 411 and the second magnet 412. Accordingly, the average magnetic forces acting on entire area of the mask sheet 42 during the first movement M1 may be all the same as the middle value of the magnetic force, and a uniform degree of adhesion may be provided to entire area between the mask sheet 42 and the display substrate DS.

Figure 7:
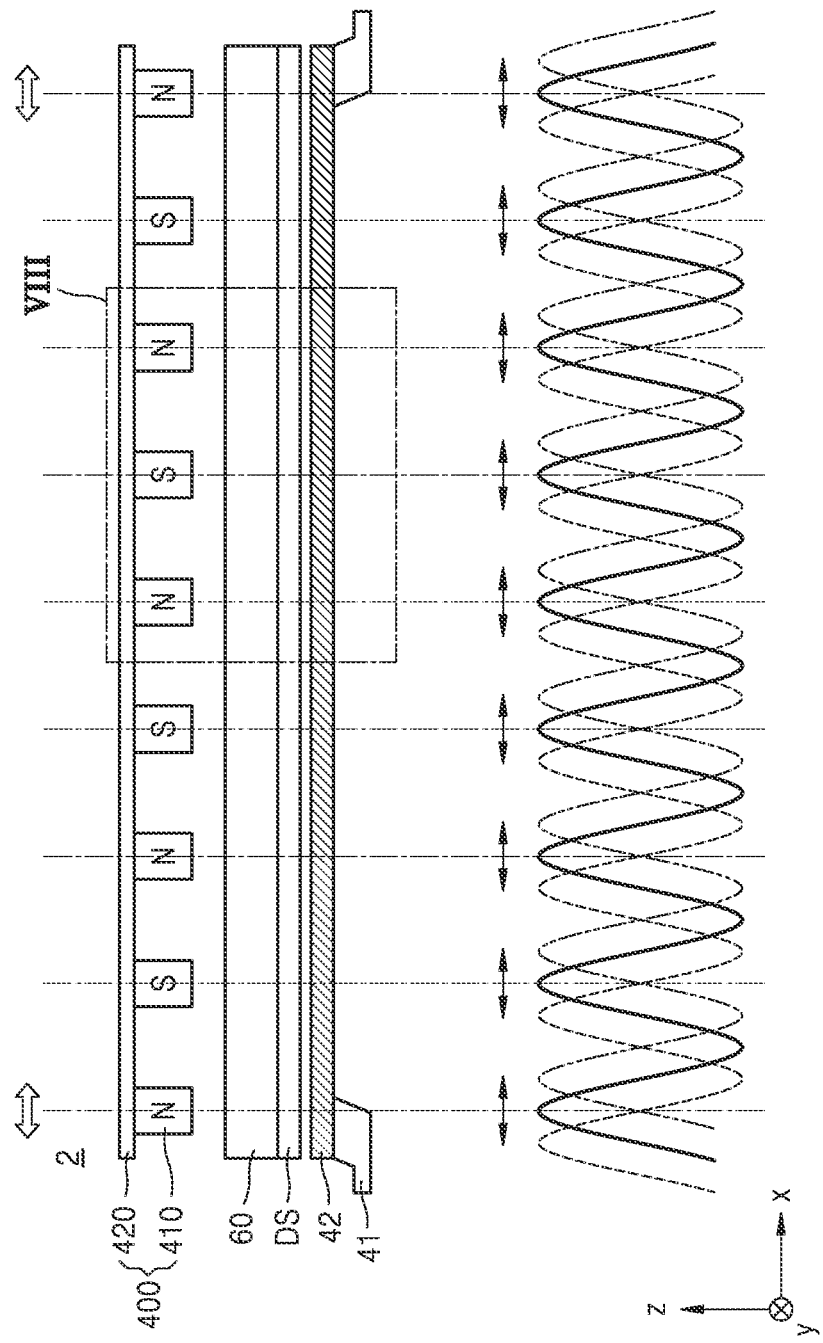
FIG. 7 is a schematic cross-sectional view of an apparatus for manufacturing a display apparatus according to one or more embodiments.

FIG. 7 is a schematic cross-sectional view of an apparatus for manufacturing a display apparatus according to one or more embodiments. In the following description, differences from the embodiment described above are discussed.

Referring to FIG. 7, the magnetic force portion 400 may reciprocate in a third direction, for example, an x direction of FIG. 7, crossing the first direction in which the magnet 410 extends, for example, a y direction of FIG. 7, and then reciprocate in a fourth direction, for example, a −x direction of FIG. 7, opposite to the third direction. The magnetic force portion 400 may repeat the reciprocation in the third direction and the reciprocation in the fourth direction, and thus, the movement of the magnetic force portion 400 as above may mean a vibration in the third direction and the fourth direction with respect to the stop position.

Figure 8:
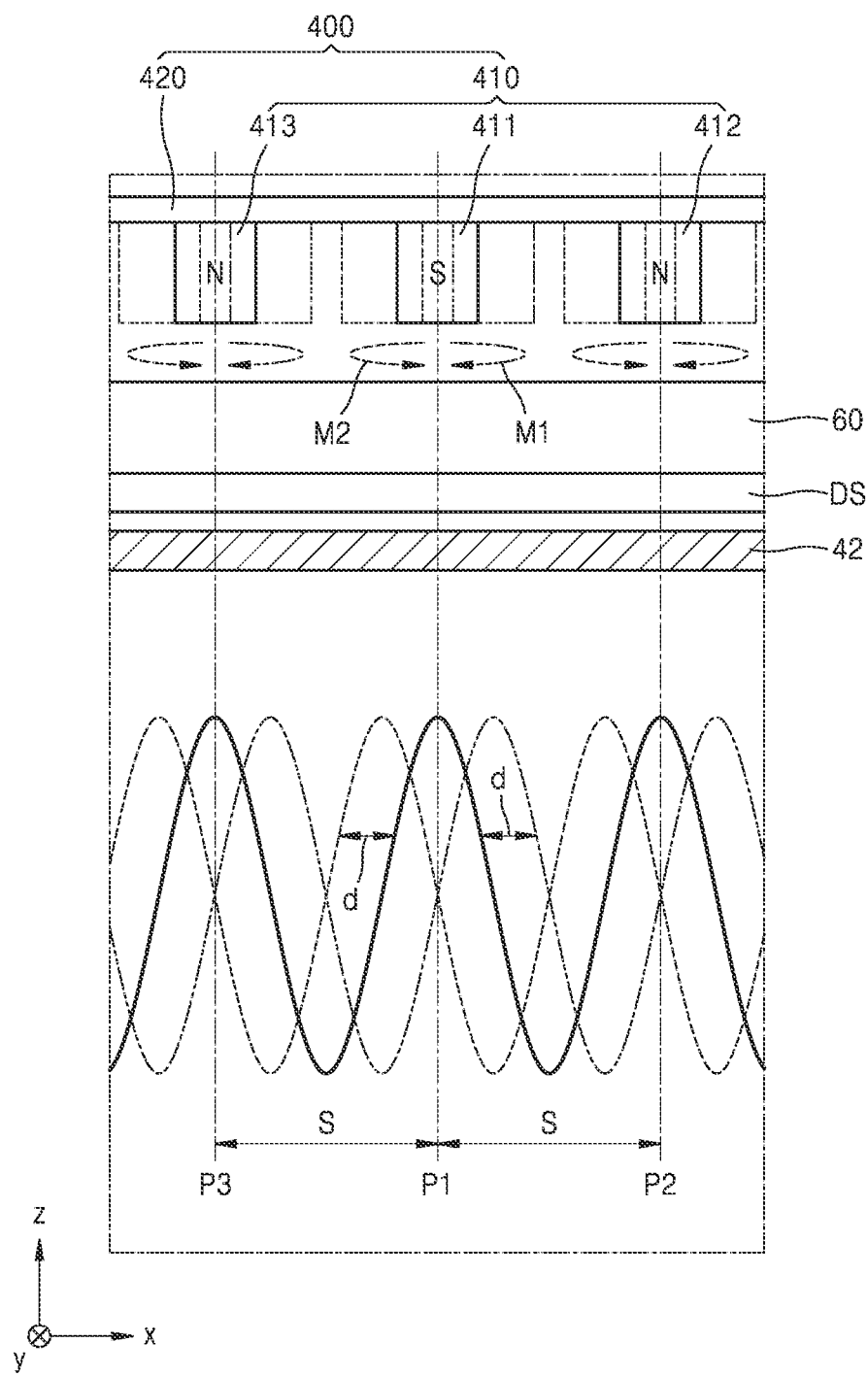
FIG. 8 is a schematic cross-sectional view of an apparatus for manufacturing a display apparatus by enlarging region VIII of FIG. 7.

FIG. 8 is a schematic cross-sectional view of an apparatus for manufacturing a display apparatus by enlarging region VIII of FIG. 7.

Referring to FIG. 8, the magnets 410 may reciprocate in the third direction, for example, an x direction of FIG. 8. In detail, the magnets 410 may perform the first movement M1 of moving in the third direction from the stop position illustrated in FIG. 3 and then returning to the stop position. After the first movement M1, the magnets 410 may reciprocate from the stop position illustrated in FIG. 3 in a fourth direction, for example, a −x direction of FIG. 8, opposite to the third direction. The magnets 410 may repeat the above movement. In other words, the first magnet 411 may repeat movements of moving from the first point P1 toward the second point P2 and then returning to the first point P1, and moving from the first point P1 toward the third point P3 and then returning to the first point P1.

Accordingly, similarly to the above description, a magnetic force acting on the mask sheet 42 may continuously change. Compared to a case in which the magnetic force portion 400, for example, the magnets 410 continuously applies a magnetic force to the mask sheet 42 at the stop position without changing the total amount of the magnetic force acting on the mask sheet 42, the average magnetic force acting on each point of the mask sheet 42 may approach the middle value. Furthermore, the maximum value and the minimum value of the magnetic force may not concentrate on a particular point of the mask sheet 42.

In the apparatus 2 for manufacturing a display apparatus, according to one or more embodiments, as described above, due to the reciprocation of the magnetic force portion 400, a relatively uniform magnetic force may be applied to the mask sheet 42, and thus, a deposition defect, such as line mura, in a display apparatus may be prevented.

In an embodiment, the distances d that the magnetic force portion 400 moves in the third direction and the fourth direction during the first movement M1 and the second movement M2 may be identical to each other. Furthermore, each of the distances d that the magnetic force portion 400 moves in the third direction and the fourth direction during the first movement M1 and the second movement M2 may be less than the distance S between the two adjacent magnets 410 among the magnets 410. For example, the distance d may be less than the distance S between the first magnet 411 and the second magnet 412.

In another embodiment, the distances d that the magnetic force portion 400 moves in the third direction and the fourth direction during the first movement M1 and the second movement M2 may be equal to the distance S between the two adjacent magnets 410 among the magnets 410 or may be a multiple of the distance S.

Accordingly, as described above, each of the magnets 410 may move the distance S corresponding to the period of the sine function, which is same as the distance d between the first magnet 411 and the second magnet 412, and thus, the average magnetic forces acting on entire area of the mask sheet 42 during the first movement M1 may be all identical as the middle value of the magnetic force. Accordingly, the same average magnetic force may be applied to entire area of the mask sheet 42 and a uniform degree of adhesion may be provided to entire area between the mask sheet 42 and the display substrate DS.

Figure 9:
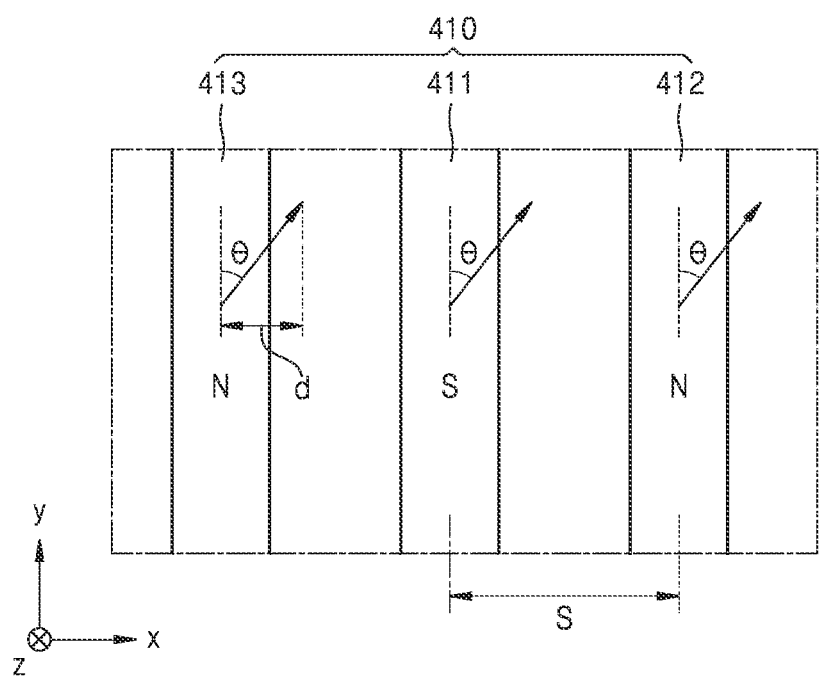
FIG. 9 is a plan view of an apparatus for manufacturing a display apparatus according to one or more embodiments.

FIG. 9 is a plan view of an apparatus for manufacturing a display apparatus according to one or more embodiments. FIG. 9 illustrates, for example, an apparatus for manufacturing a display apparatus of FIG. 4 viewed from a −z direction, and for convenience of explanation, the support plate 420 is omitted and only parts of the magnets 410 are illustrated.

Referring to FIG. 9, the magnetic force portion 400 (see FIG. 4) may reciprocate in a third direction crossing the first direction in which the magnet 410 extends, for example, a y direction of FIG. 9.

The third direction in which the magnet 410 reciprocates may be inclined to the first direction in an embodiment, unlike the third direction that is perpendicular to the first direction in the embodiment described above. In other words, the third direction may form an acute angle with the first direction. The third direction may form an acute angle with the second direction in which the magnets 410 are arranged. Accordingly, the magnetic force portion 400, for example, the magnets 410, may reciprocate in the third direction forming an acute angle with the first direction in which the magnet 410 extends, or in the third direction forming an acute angle with the second direction in which the magnets 410 are arranged.

It may be understood that, similarly to the above description, the magnets 410 may repeat only the first movement M1 (see FIG. 5) in the third direction, or may repeat the second movement M2 in a fourth direction opposite to the third direction after the first movement M1 in the third direction.

Furthermore, with respect to the distance that the magnets 410 move, orthogonal projection d of the distance that the magnets move in a direction perpendicular to the first direction may be, as described above, less than the distance S between the two adjacent magnets 410 or may be the same as or a multiple of the distance S.

Accordingly, the apparatus 2 for manufacturing a display apparatus may apply a relatively uniform magnetic force to the mask sheet 42 due to the reciprocation of the magnetic force portion 400, and thus, a deposition defect, such as line mura, may be prevented in a display apparatus.

Figure 10:
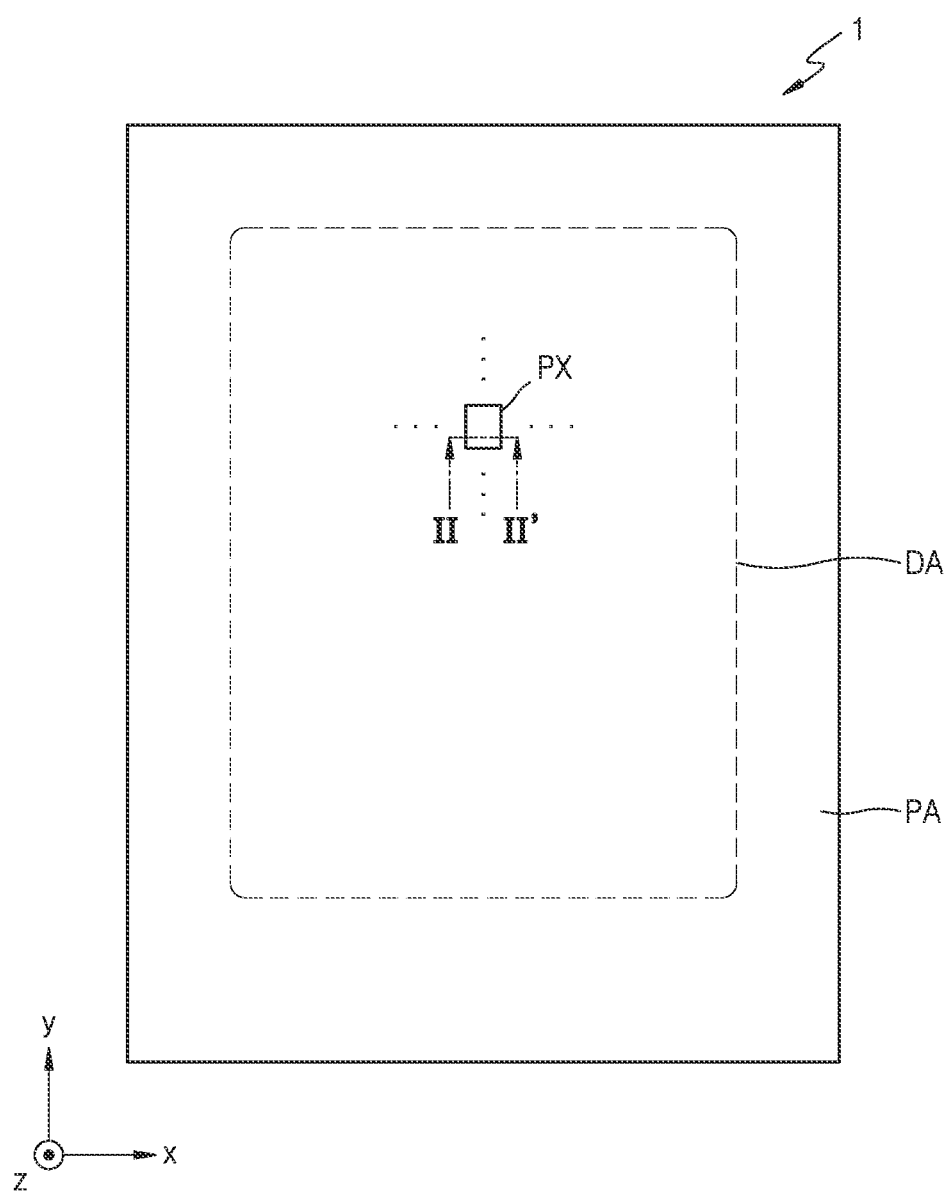
FIG. 10 is a schematic plan view of a display apparatus manufactured by an apparatus for manufacturing a display apparatus according to one or more embodiments.

FIG. 10 is a schematic plan view of a display apparatus 1 manufactured by an apparatus for manufacturing a display apparatus according to one or more embodiments.

Referring to FIG. 10, the display apparatus 1 manufactured according to one or more embodiments may include a display area DA and a peripheral area PA disposed adjacent to the display area DA. The display apparatus 1 may provide an image through an array of multiple pixels PX two-dimensionally arranged in the display area DA.

The peripheral area PA, which is an area that does not provide an image, may entirely or partially surround the display area DA. A driver and the like for providing an electrical signal or power to a pixel circuit corresponding to each of the pixels PX may be arranged in the peripheral area PA. A pad that is a portion to which an electronic device, a printed circuit board, and the like are electrically connected may be arranged in the peripheral area PA.

In the following description, although the display apparatus 1 is described as including an organic light-emitting diode as a light-emitting device, the display apparatus 1 is not limited thereto. In another embodiment, the display apparatus 1 may be a light-emitting display apparatus including an inorganic light-emitting diode, for example, an inorganic light-emitting display apparatus. The inorganic light-emitting diode may include a PN diode including materials based on an inorganic material semiconductor. In case that a voltage is applied to a PN junction diode in a forward direction, holes and electrons may be injected, and energy generated by a recombination of the holes and the electronics may be converted to light energy, thereby emitting light of a certain color. The inorganic light-emitting diode described above may have a width of several to hundreds of micrometers. In some embodiments, the inorganic light-emitting diode may be referred to as a micro LED. In another embodiment, the display apparatus 1 may be a quantum-dot light-emitting display apparatus.

The display apparatus 1 may be used as a display screen of portable electronic apparatuses, such as mobile phones, smartphones, tablet personal computers (PCs), mobile communication terminals, electronic organizers, electronic books, portable multimedia players (PMPs), navigations, ultra mobile PC (UMPCs), and the like, and may be also used as various products, such as televisions, notebook computers, monitors, billboards, Internet of things (IOT), and the like. Furthermore, the display apparatus 1 according to an embodiment may be used for wearable devices, such as smart watches, watch phones, glasses-type displays, and head mounted displays (HMDs). Furthermore, the display apparatus 1 according to an embodiment may be used as an instrument panel of a vehicle, and a center information display (CID) disposed on the center fascia or dashboard of a vehicle, a room mirror display that may replace a side mirror of a vehicle, or a display screen disposed at the back of the front seat as entertainment for the rear seat.

Figure 11:
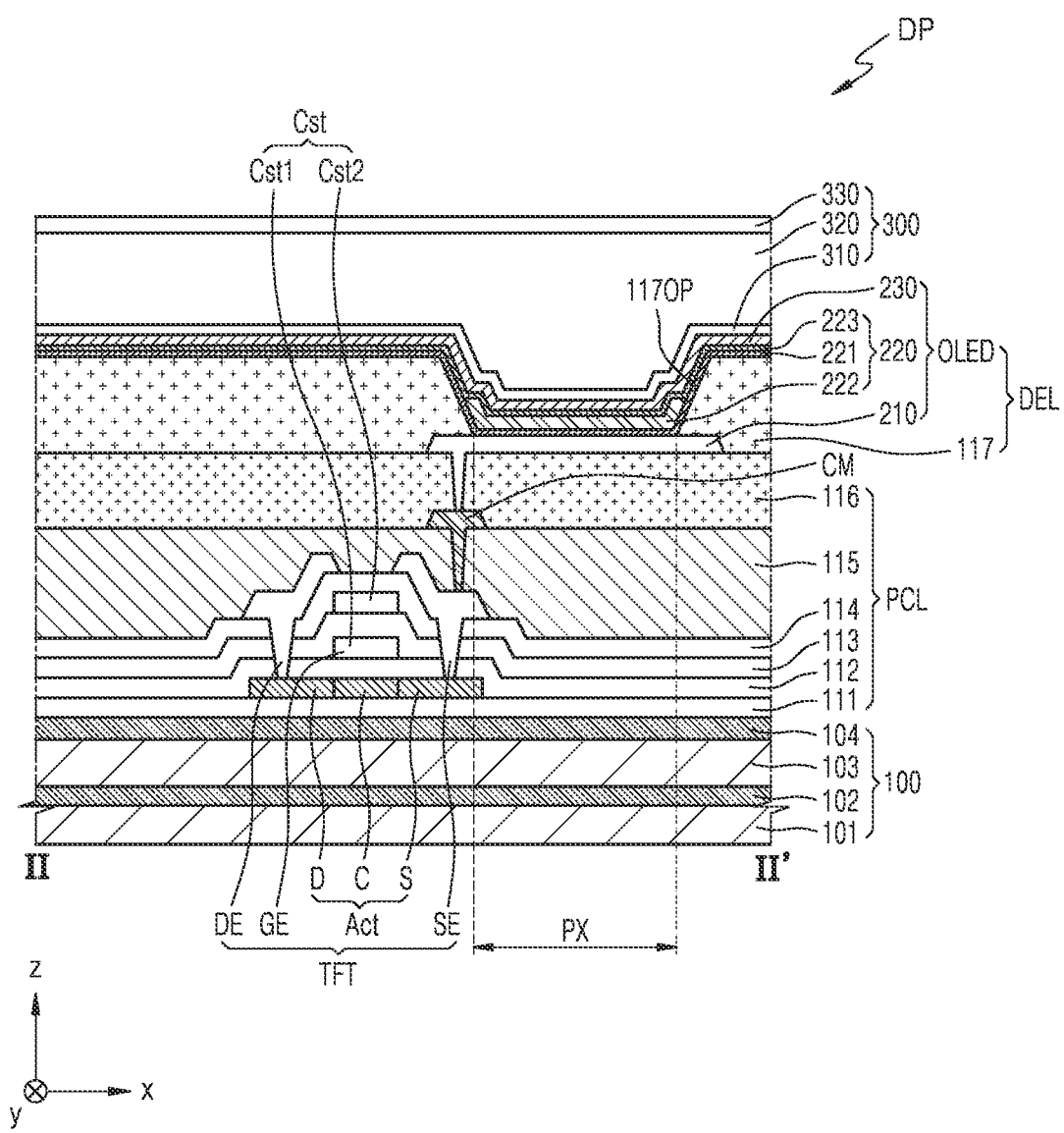
FIG. 11 is a schematic cross-sectional view of a display apparatus manufactured by using an apparatus for manufacturing a display apparatus according to one or more embodiments.

FIG. 11 is a schematic cross-sectional view of a display apparatus manufactured by using an apparatus for manufacturing a display apparatus according to one or more embodiments, and may correspond to a cross-section of the display apparatus taken along line II-II' of FIG. 10.

Referring to FIG. 11, the display apparatus 1 may include a stack structure of the substrate 100, a pixel circuit layer PCL, a display element layer DEL, and an encapsulation layer 300. The display substrate DS of FIG. 1 may be in the middle of a process of manufacturing the display apparatus 1, for example, at least one of the pixel circuit layer PCL, the display element layer DEL, and the encapsulation layer 300 may be stacked on the substrate 100.

The substrate 100 may be a multilayer structure of a base layer and an inorganic layer, the base layer including polymer resin. For example, the substrate 100 may include a base layer and an inorganic insulating layer as a barrier layer, the base layer including polymer resin. For example, the substrate 100 may include a first base layer 101, a first barrier layer 102, a second base layer 103, and a second barrier layer 104, which are sequentially stacked. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulphide (PPS), polycarbonate (PC), cellulose triacetate (TAC), cellulose acetate propionate (CAP), and/or the like. The first barrier layer 102 and the second barrier layer 104 may include an inorganic insulating material, such as silicon oxide, silicon oxynitride, and/or silicon nitride. The substrate 100 may be flexible.

The pixel circuit layer PCL may be disposed on the substrate 100. FIG. 11 illustrates that the pixel circuit layer PCL includes a thin film transistor TFT, and layers which are disposed below and/or above constituent elements of the thin film transistor TFT including a buffer layer 111, a first gate insulating layer 112, a second gate insulating layer 113, an interlayer insulating layer 114, a first planarization insulating layer 115, and a second planarization insulating layer 116.

The buffer layer 111 may reduce or block foreign materials, moisture, or external air from under the substrate 100, and may provide a planarized surface on the substrate 100. The buffer layer 111 may include an inorganic insulating material, such as silicon oxide, silicon oxynitride, and silicon nitride, and may have a single layer or multilayer structure including the material described above.

The thin film transistor TFT on the buffer layer 111 may include a semiconductor layer Act, and the semiconductor layer Act may include polysilicon. In another embodiment, the semiconductor layer Act may include amorphous silicon, an oxide semiconductor, an organic semiconductor, or the like. The semiconductor layer Act may include a channel region C and a drain region D and a source region S respectively disposed at both sides of the channel region C. A gate electrode GE may overlap the channel region C.

The gate electrode GE may include a low-resistance metal material. The gate electrode GE may include a conductive material including molybdenum (Mo), aluminum (Al), copper (Cu), titanium (Ti), and the like, and may be formed in a multilayer or single layer of the conductive material.

The first gate insulating layer 112 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. $ZnO_x$ may be zinc oxide (ZnO), and/or zinc peroxide ($ZnO_2$).

The second gate insulating layer 113 may be provided to cover the gate electrode GE. The second gate insulating layer 113, similarly to the first gate insulating layer 112, may include an inorganic insulating material, such as $SiO_2$, $SiN_x$, SiON, $Al_2O_3$, $TiO_2$, $Ta_2O_5$, $HfO_2$, $ZnO_x$, or the like. $ZnO_x$ may be ZnO and/or $ZnO_2$.

An upper electrode Cst2 of a storage capacitor Cst may be disposed above the second gate insulating layer 113. The upper electrode Cst2 may overlap the gate electrode GE thereunder. The gate electrode GE and the upper electrode Cst2 overlapping each other with the second gate insulating layer 113 therebetween may form the storage capacitor Cst. In other words, the gate electrode GE may function as a lower electrode Cst1 of the storage capacitor Cst.

As such, the storage capacitor Cst and the thin film transistor TFT may be formed to overlap each other. In some embodiments, the storage capacitor Cst may be formed not to overlap the thin film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer of the material described above.

The interlayer insulating layer 114 may cover the upper electrode Cst2. The interlayer insulating layer 114 may include $SiO_2$, $SiN_x$, SiON, $Al_2O_3$, $TiO_2$, $Ta_2O_5$, $HfO_2$, or $ZnO_x$, and the like. $ZnO_x$ may be ZnO and/or $ZnO_2$. The interlayer insulating layer 114 may be a single layer or multilayer including the inorganic insulating material described above.

A drain electrode DE and a source electrode SE may each be disposed on the interlayer insulating layer 114. The drain electrode DE and the source electrode SE may be respectively electrically connected to the drain region D and the source region S through a contact hole formed in the insulating layers thereunder. The drain electrode DE and the source electrode SE may each include a material having a good conductivity. The drain electrode DE and the source electrode SE may each include a conductive material including Mo, Al, Cu, Ti, and the like, and may be formed in a multilayer or single layer including the conductive material. In an embodiment, the drain electrode DE and the source electrode SE may each have a multilayer structure of Ti/Al/Ti.

The first planarization insulating layer 115 may cover the drain electrode DE and the source electrode SE. The first planarization insulating layer 115 may include an organic insulating material, such as general purpose polymers, such as polymethylmethacrylate (PMMA) or polystyrene (PS), polymer derivatives having a phenolic group, acrylic polymers, imide-based polymers, aryl ether-based polymers, amide-based polymers, fluorine-based polymers, p-xylene-based polymers, vinyl alcohol-based polymers, and blends thereof.

The second planarization insulating layer 116 may be disposed on the first planarization insulating layer 115. The second planarization insulating layer 116 and the first planarization insulating layer 115 may include the same material, and may include an organic insulating material, such as general purpose polymers, such as PMMA or PS, polymer derivatives having a phenolic group, acrylic polymers, imide-based polymers, aryl ether-based polymers, amide-based polymers, fluorine-based polymers, p-xylene-based polymers, vinyl alcohol-based polymers, and blends thereof.

The display element layer DEL may be disposed on the pixel circuit layer PCL having the structure described above. The display element layer DEL may include a display element, for example, an organic light-emitting diode (OLED), as a light-emitting device, and the organic light-emitting diode OLED may include a stack structure of a pixel electrode 210, an intermediate layer 220, and a common electrode 230. The organic light-emitting diode OLED may emit, for example, red, green, blue light, or white light. The organic light-emitting diode OLED may emit light through a light-emitting area, and the light-emitting area may be defined as a pixel PX.

The pixel electrode 210 of the organic light-emitting diode OLED may be electrically connected to the thin film transistor TFT through contact holes formed in the second planarization insulating layer 116 and the first planarization insulating layer 115 and a contact metal CM disposed on the first planarization insulating layer 115.

The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective film including Ag, Mg, Al, Pt, Pd, Au, Ni, Nd, Ir, Cr, or a compound thereof. In another embodiment, the pixel electrode 210 may also include a film formed of ITO, IZO, ZnO, or $In_2O_3$ above or below the reflective film described above.

A pixel defining layer 117 having an opening 1170P that exposes a central portion of the pixel electrode 210 may be disposed on the pixel electrode 210. The pixel defining layer 117 may include an organic insulating material and/or an inorganic insulating material. The opening 1170P may define a light-emitting area of light emitted from the organic light-emitting diode OLED. For example, the size or width of the opening 1170P may correspond to the size or width of the light-emitting area. Accordingly, the size and/or width of the pixel PX may be dependent on the size and/or width of the opening 1170P of the pixel defining layer 117 corresponding thereto.

The intermediate layer 220 may include an emission layer 222 formed to correspond to the pixel electrode 210. The emission layer 222 may include a polymer or a low molecular weight organic material that emits light of a certain color. In another embodiment, the emission layer 222 may include an inorganic light-emitting material or quantum dots.

In an embodiment, the intermediate layer 220 may include a first functional layer 221 and a second functional layer 223 disposed below and above the emission layer 222. The first functional layer 221 may include, for example, a hole transport layer HTL, or a hole transport layer HTL and a hole injection layer HIL. The second functional layer 223 may include an electron transport layer ETL and/or an electron injection layer EIL, as constituent elements disposed above the emission layer 222. The first functional layer 221 and/or the second functional layer 223 may be a common layer formed to entirely cover the substrate 100, like the common electrode 230 to be described below.

The common electrode 230 may be disposed on the pixel electrode 210, and may overlap the pixel electrode 210. The common electrode 230 may include a conductive material having a low work function. For example, the common electrode 230 may include a (semi-)transparent layer including Ag, Mg, Al, Pt, Pd, Au, Ni, Nd, Ir, Cr, lithium (Li), Ca, an alloy thereof, or the like. In another embodiment, the common electrode 230 may also include a layer, such as ITO, IZO, ZnO or $In_2O_3$, on the (semi-)transparent layer including the material described above. The common electrode 230 may be integrally formed to entirely cover the substrate 100.

The encapsulation layer 300 may be disposed on the display element layer DEL and may cover the display element layer DEL. The encapsulation layer 300 may include at least one inorganic encapsulation layer and at least one organic encapsulation layer. As an embodiment, FIG. 11 illustrates that the encapsulation layer 300 includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may include one or more inorganic materials including aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acrylic resin, epoxy-based resin, polyimide, polyethylene, and the like. In an embodiment, the organic encapsulation layer 320 may include acrylate. The organic encapsulation layer 320 may be formed by curing a monomer or by coating a polymer. The organic encapsulation layer 320 may have transparency.

A touch sensor layer (not shown) may be disposed on the encapsulation layer 300, and an optical functional layer may be disposed on the touch sensor layer. The touch sensor layer may obtain coordinates information based on an external input, for example, a touch event. The optical functional layer may reduce reflectivity of light (external light) incident on a display apparatus from the outside, and/or may improve color purity of light emitted from the display apparatus. In an embodiment, the optical functional layer may include a retarder and/or a polarizer. The retarder may be a film type or a liquid crystal coating type, and may include a $\lambda/2$ retarder and/or a $\lambda/4$ retarder. The polarizer may also be a film type or a liquid crystal coating type. The film type may include a stretch-type synthetic resin film, and the liquid crystal coating type may include liquid crystals arranged in a certain array. The retarder and the polarizer may each also include a protection film.

An adhesive member may be disposed between the touch sensor layer and the optical functional layer. Any member in the field of technology may be employed as an adhesive member without a limit. The adhesive member may be a pressure sensitive adhesive (PSA).

According to one or more embodiments, as the mask and the substrate are uniformly and well adhered to each other, a deposition defect due to a shadow may be prevented. Furthermore, accordingly, a stain defect occurring in a display apparatus may be prevented.

The effects of the disclosure are not limited to the above-described effects, and other various effects that are not described in the specification may be clearly understood from the following descriptions by one skilled in the art to which the disclosure belongs.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those ordinary skill in the art that various changes in form and details may be made therein without departing from the spirit and scope as defined by the following claims.

What is claimed is:

1. An apparatus for manufacturing a display apparatus, the apparatus comprising:

a chamber;

a mask assembly disposed in the chamber on a first side of a display substrate;

a deposition source disposed to face the mask assembly and supplying a deposition material that passes through the mask assembly; and a magnetic force portion comprising a plurality of magnets extending in a first direction parallel to the mask assembly and disposed on a side opposite to the first side of the display substrate, wherein the magnetic force portion repeatedly reciprocates in a direction intersecting the first direction while the deposition material is being deposited on the display substrate.

2. The apparatus of claim 1, wherein the magnetic force portion repeats a first movement of moving from a stop position in the direction intersecting the first direction and returning to the stop position.

3. The apparatus of claim 2, wherein, during the first movement, a distance that the magnetic force portion moves is less than a distance between adjacent ones of the plurality of magnets.

4. The apparatus of claim 2, wherein, during the first movement, a distance that the magnetic force portion moves is a multiple of a distance between adjacent ones of the plurality of magnets.

5. The apparatus of claim 1, wherein the direction intersecting the first direction is perpendicular to the first direction.

6. The apparatus of claim 1, wherein the direction intersecting the first direction forms an acute angle with the first direction.

7. The apparatus of claim 1, wherein the magnetic force portion repeats:

a first movement of moving from a stop position in the direction intersecting the first direction and returning to the stop position; and a second movement of moving from the stop position in a direction opposite to the direction intersecting the first direction and returning to the stop position.

8. The apparatus of claim 1, wherein the magnetic force portion further comprises a support plate accommodating the plurality of magnets and capable of moving, and the apparatus further comprising a driving portion that reciprocates the support plate in the direction intersecting the first direction.

9. The apparatus of claim 1, wherein the plurality of magnets are spaced apart from each other in a second direction intersecting the first direction, the plurality of magnets comprises:

first magnets, each including a side facing the mask assembly having a polarity of N; and second magnets, each including a side facing the mask assembly having a polarity of S, and the first magnets and the second magnets are alternately arranged.

10. The apparatus of claim 9, wherein a magnetic force of the magnetic force portion in the second direction comprises a sine curve.

11. The apparatus of claim 9, wherein the magnetic force portion reciprocates in the second direction.

12. The apparatus of claim 9, wherein the mask assembly comprises a plurality of mask sheets extending in the second direction, and the magnetic force portion reciprocates in the second direction.

* * * * *